(12) United States Patent
Wang et al.

(10) Patent No.: US 7,154,155 B2
(45) Date of Patent: Dec. 26, 2006

(54) WING-SHAPED SURFACE MOUNT PACKAGE FOR LIGHT EMITTING DIODES

(75) Inventors: Bily Wang, Hsin-Chu (TW); Bill Chang, Hsin-Chu (TW)

(73) Assignee: Harvatek Corp., Hsin-Chu (TW)

( * ) Notice: Subject to any disclaimer, the term of this patent is extended or adjusted under 35 U.S.C. 154(b) by 339 days.

(21) Appl. No.: 10/261,062

(22) Filed: Nov. 22, 2002

(65) Prior Publication Data

US 2003/0178691 A1 Sep. 25, 2003

Related U.S. Application Data

(62) Division of application No. 09/982,370, filed on Oct. 19, 2001, now abandoned.

(51) Int. Cl.
*H01L 31/00* (2006.01)

(52) U.S. Cl. .................. 257/431; 257/433; 257/787; 257/666; 257/676

(58) Field of Classification Search .............. 257/676, 257/666, 787, 431, 433
See application file for complete search history.

(56) References Cited

U.S. PATENT DOCUMENTS

| 5,521,429 | A | * | 5/1996 | Aono et al. ............ 257/676 |
| 6,054,716 | A | * | 4/2000 | Sonobe et al. ......... 250/552 |
| 6,392,294 | B1 | * | 5/2002 | Yamaguchi ............. 257/690 |
| 2002/0047187 | A1 | * | 4/2002 | Nakajima et al. ....... 257/666 |

* cited by examiner

*Primary Examiner*—Nathan J. Flynn
*Assistant Examiner*—Pershelle Greene
(74) *Attorney, Agent, or Firm*—Rosenberg, Klein & Lee

(57) ABSTRACT

A surface mounted LED package includes a pair of metal contact plates, an LED mounted to one (or both) metal contact plates, and glue encapsulating the LED and holding the LED and both metal contact plates together to form a LED package to be soldered to a motherboard. The contact plates have side notches and bottom recesses of various shapes and dimensions, as well as through holes extending through the entire width of the contact plates to facilitate the glue flow for filling out the side notches and bottom recesses for improved solidifying of the LED package. The contact plates have portions uncovered by the glue to provide extended areas for soldering to a motherboard.

10 Claims, 14 Drawing Sheets

WING-SHAPED SURFACE MOUNT PACKAGE FOR LIGHT EMITTING DIODES

This is a divisional application of patent application Ser. No. 09/982,370 filed Oct. 19, 2001, now abandoned.

BACKGROUND OF THE INVENTION (1) Filed of the Invention (2) Brief Description of the Related Art Prior art surface mount LED packages, as shown in FIGS. 1, 2 and disclosed in Taiwan Patent Application No. 089109999 and co-pending U.S. patent application Ser. No. 09/596,907, have only single-side bottom metal exposed for making contact to a motherboard. The metal contact plates 11, 12 are covered with a glue 15 on the top as shown in FIG. 2. The metal places 11, 12 have recesses 14 along the vertical edges as shown in FIG. 1, and also have recesses 17 along the horizontal bottom surfaces of the metal contact plates 11, 12 as shown in FIG. 2. These recesses are for receiving the sealing glue and for holding the structure together. Tho LED 10 is mounted on the first metal contact plate 11. The top electrode of the LED 10 is wire-bonded to the second metal contact plate 12 by a wire 13.

As shown in FIG. 2 which is the cross-section view taken along the line A—A of FIG. 1, the glue 15 fills up the recesses 17 at the bottom surface of the package and the recess 14 along the vertical sides of the package to solidify the structure. This structure only exposes the bottom surfaces of metal contact plates 11, 12 not occupied by the recesses for soldering purpose. This limited area for soldering reduces the reliability of the contact.

SUMMARY OF THE INVENTION

An object of this invention is to improve the reliability of soldering of a surface mount LED package to a motherboard. Another object of this invention is to increase the soldering area of a surface mount LED package available for contact with a motherboard.

These objects are achieved by adding extensions to the metal contacts beyond the borders of the glue covering the LED. The extension provides larger areas for the contact to be soldered to a motherboard.

DETAILED DESCRIPTION OF THE INVENTION

Figure 1:
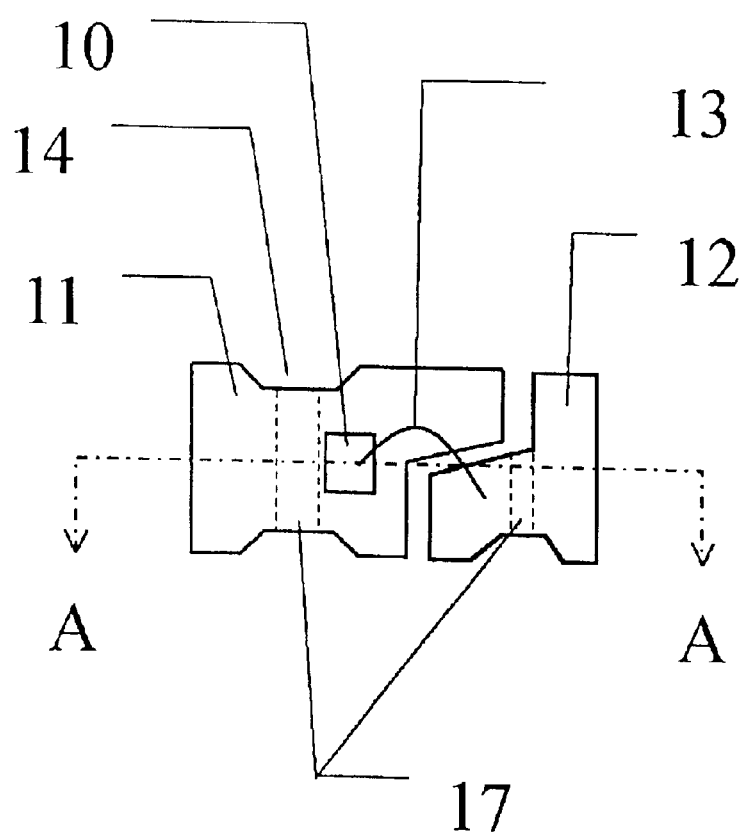
FIG. 1 shows the top view of a prior art LED package.
Figure 2:
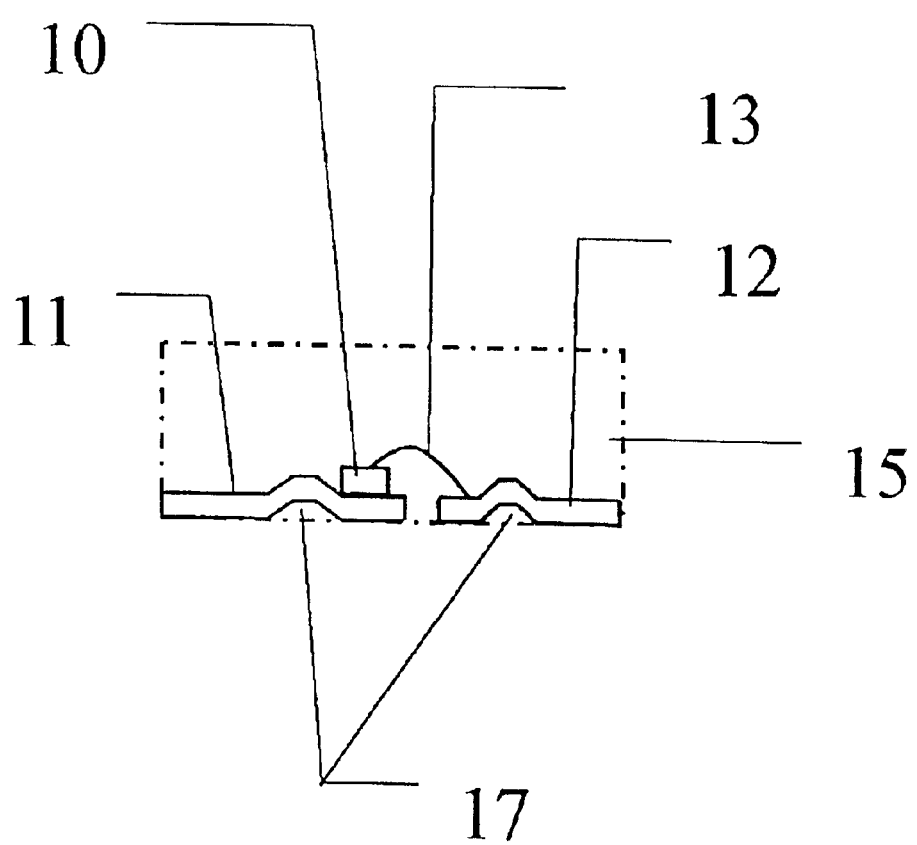
FIG. 2 shows the cross-sectional view of FIG. 1.
Figure 3:
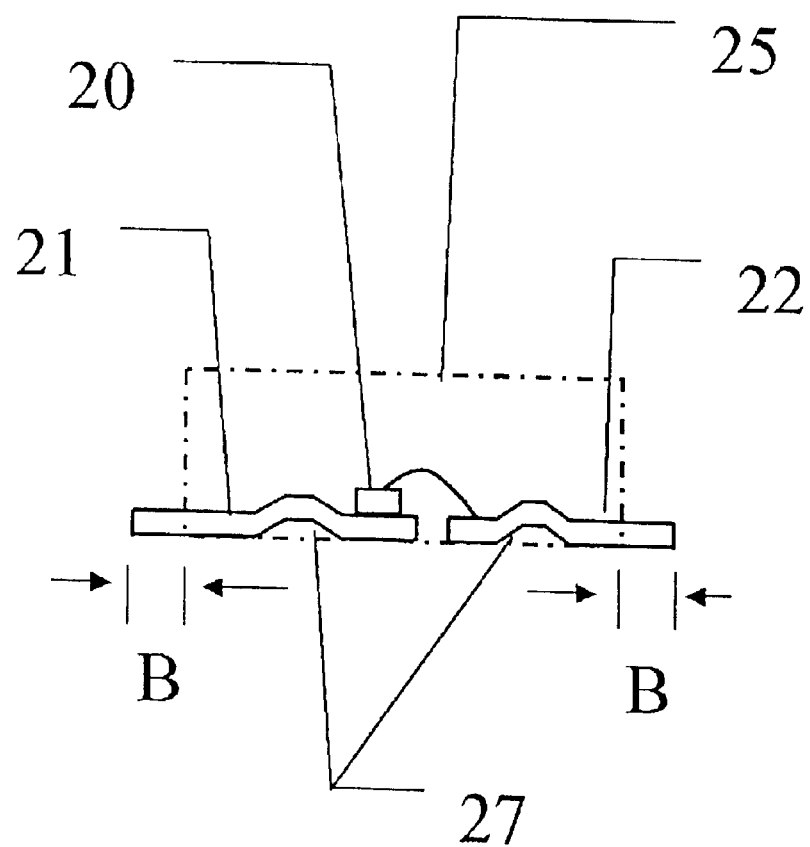
FIG. 3 shows the wing-shaped contacts of the present invention.
Figure 4:
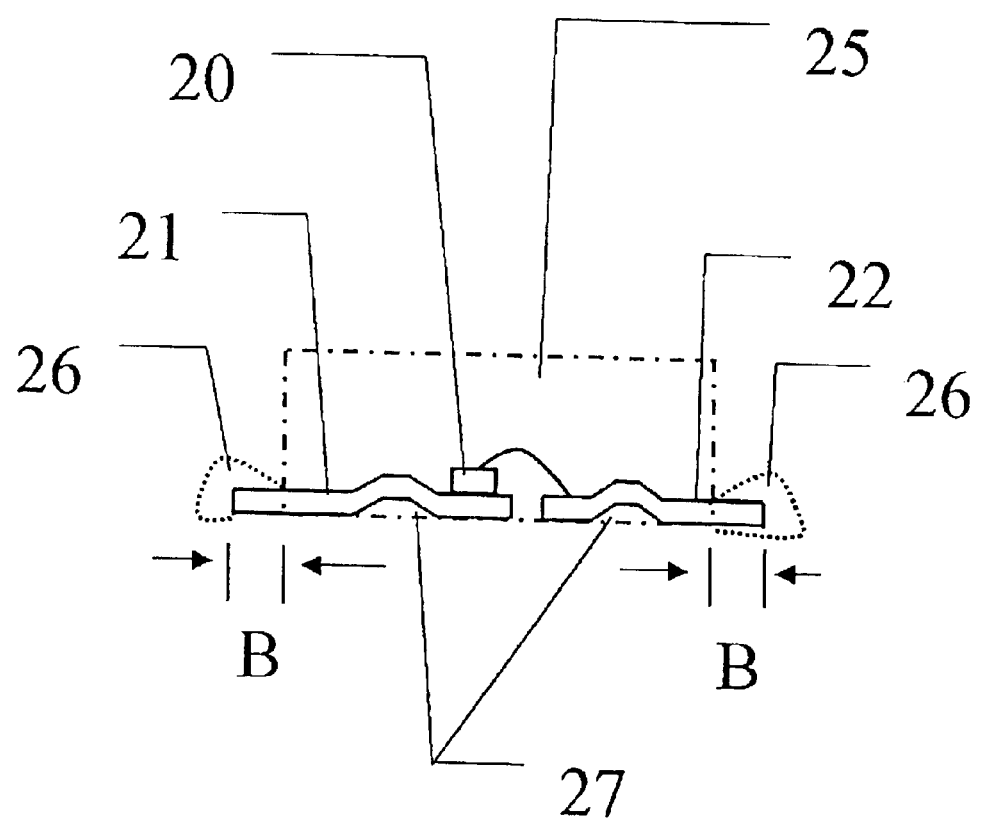
FIG. 4 shows the covering of the solder over the contact extensions.

FIG. 3 shows the basic structure of the present invention. A LED 20 with a bottom electrode is mounted on a contact metal plate 21 serving as a first terminal. The top electrode of the LED 20 is wire-bonded to a second contact metal plate 22. The contact metal plates, 21, 22 have recesses 27. The LED 20 and a portion of the top surface of the metal contact plates are covered and sealed with glue 25, leaving extensions B of the metal plate 21, 22 uncovered. During sealing, the glue also fills the recesses 27 to solidify the sealed structure. The extensions B extend outside the sealed area, and provide a large soldering area 26 for making contacts to a motherboard (not shown), as shown in FIG. 4. Thus, the solderability of the contact so a motherboard is improved.

Figure 5:
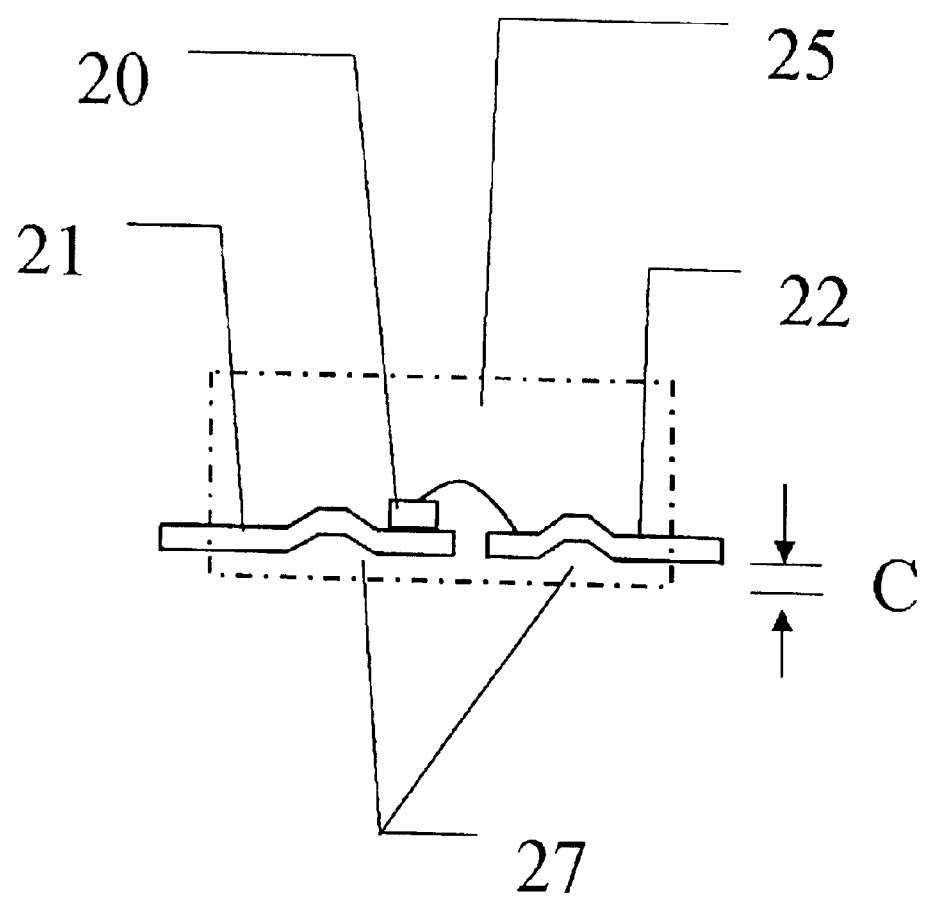
FIG. 5 shows the glue covering the bottom surfaces of the contacts.

FIG. 5 shows a second embodiment of the invention. The structure is similar to FIG. 4 except that the glue 25 extends below the bottom surfaces of the metal plates 21, 22 by a depth C. Thus the structure is more fully sealed by the glue 25. The extensions beyond the sealed area remain available for soldering to a motherboard.

Figure 6:
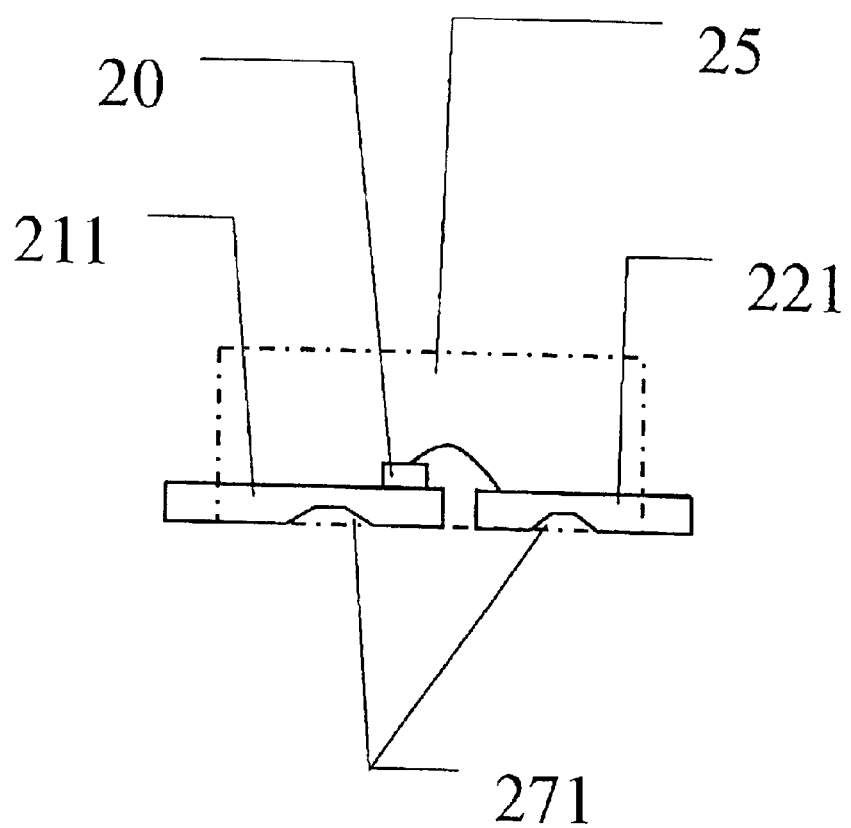
FIG. 6 shows the the contacts with flat top surfaces.

FIG. 6 shows a third embodiment of the invention. The structure is similar to FIG. 3 except that the top surfaces of the metal contact plates 211, 221 are flat. The bottom recesses 271 of such a structure can be fabricated by chemical or machine etching.

Figure 7:
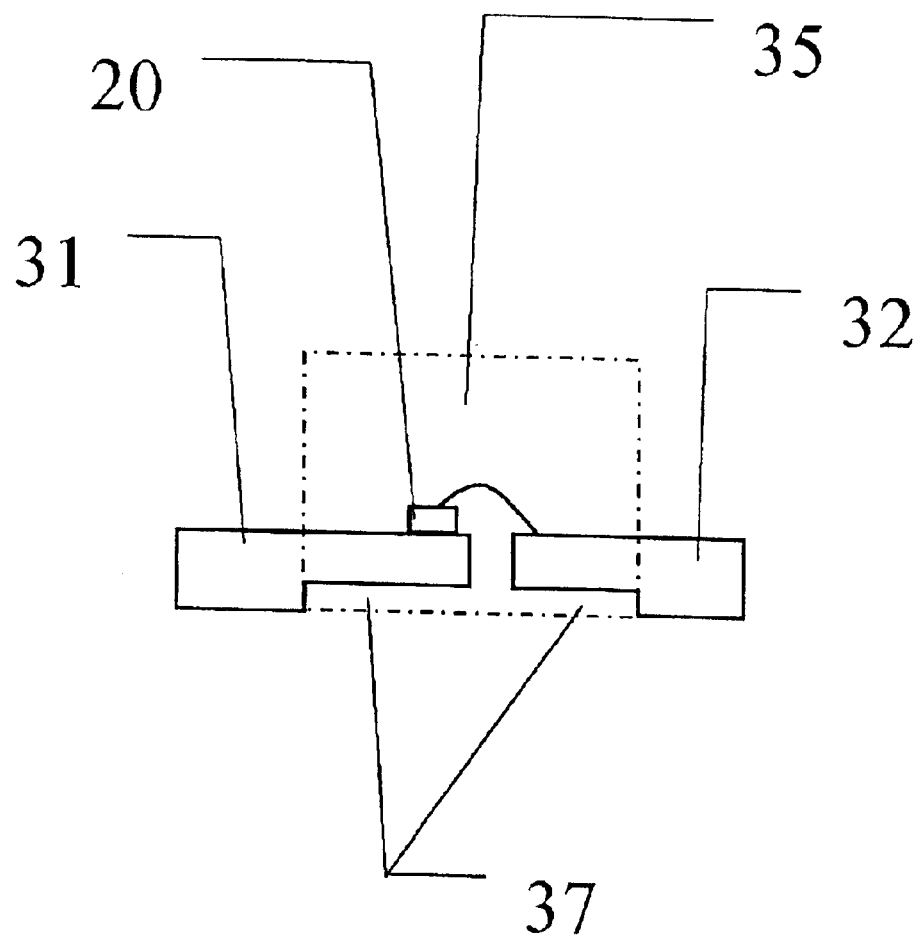
FIG. 7 shows the bottom contacts with rectangular recesses.

FIG. 7 shows a fourth embodiment of the present invention. The structure is similar to FIG. 6, except that the recess 37 at the bottom of the metal plates 31, 32 is rectangular in shape. The rectangular recess 37 holds a large amount of glue 35 to further solidify the structure.

Figure 8:
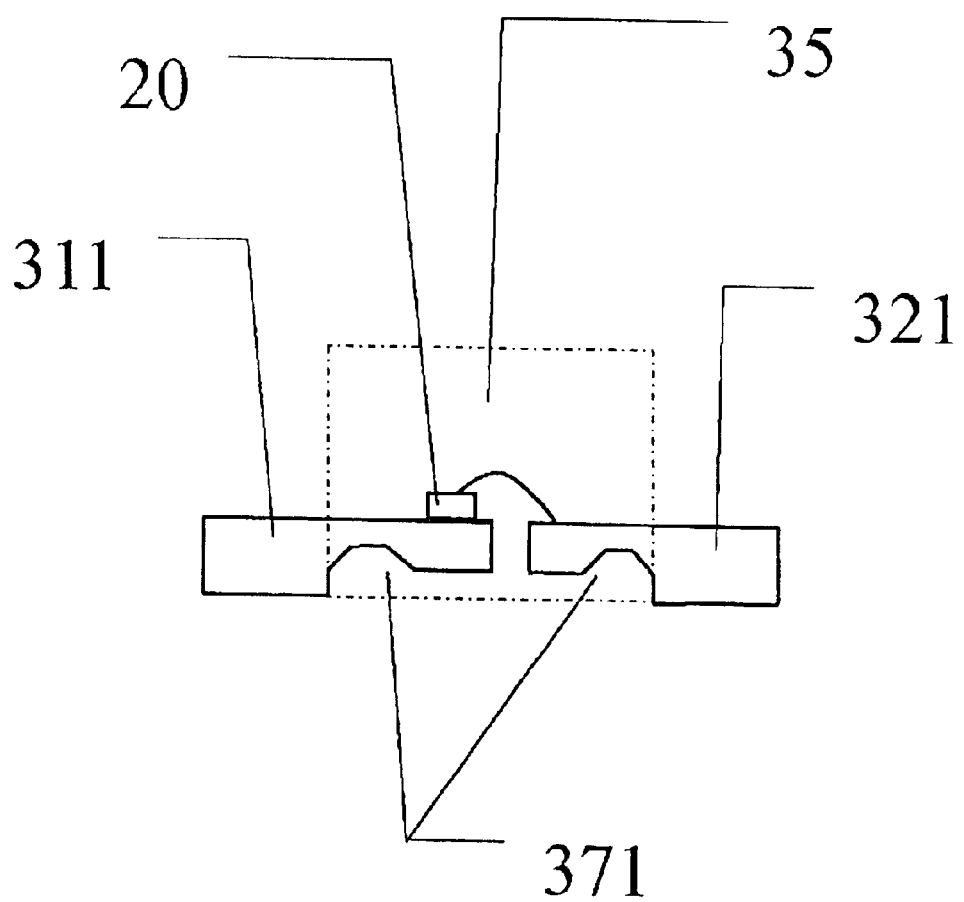
FIG. 8 shows the bottom contacts with polygonal recesses.

FIG. 8 shows a fifth embodiment of the present invention. The structure is similar to FIG. 6, except that the recess 371 at the bottom of the metal plates 311, 321 is of polygonal shape. The polygonal recess 371 holds more glue 35 to further solidify the structure.

Figure 9:
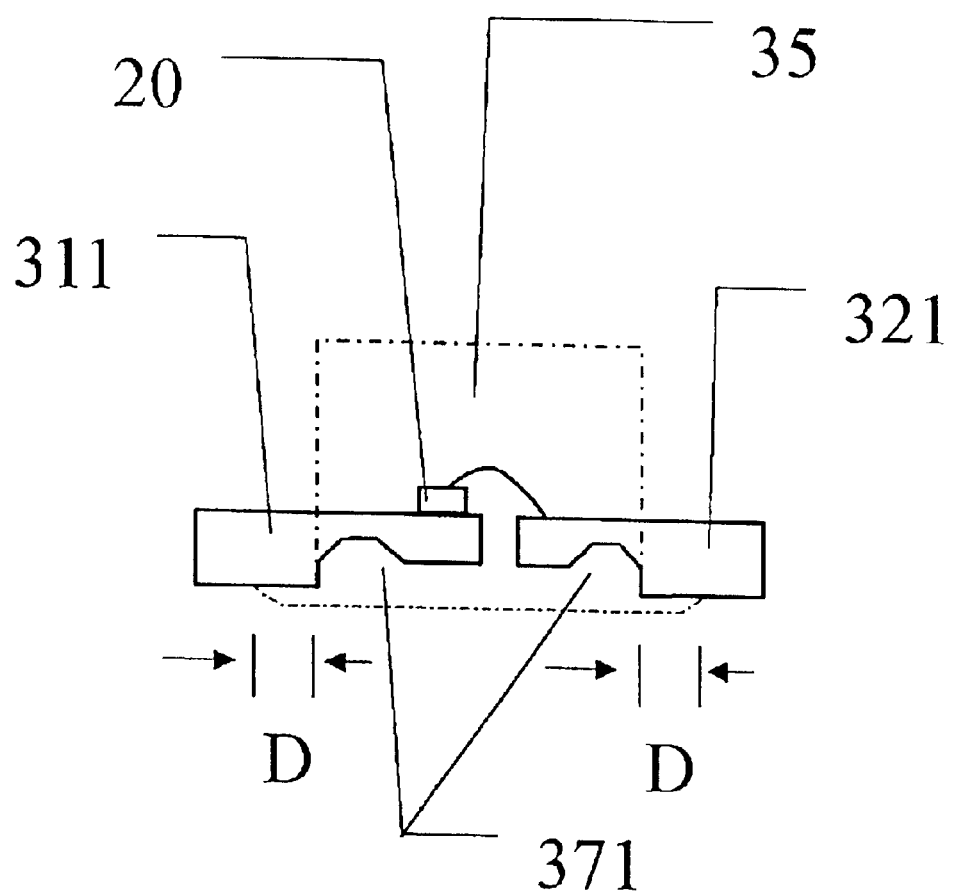
FIG. 9 shows the glue covering below the bottom surfaces of the contacts.

FIG. 9 shows a sixth embodiment of the present invention. The structure is similar to FIG. 8, except that the glued area below the recesses 371 at the bottom of the metal plates 311, 321 is made wider than the width of the glued area 35 over the LED 20. The extra widths D outside the recess 371 area increase the distance between the soldering spots on a motherboard, thus avoiding the likelihood of short-circuiting between solders.

Figure 10:
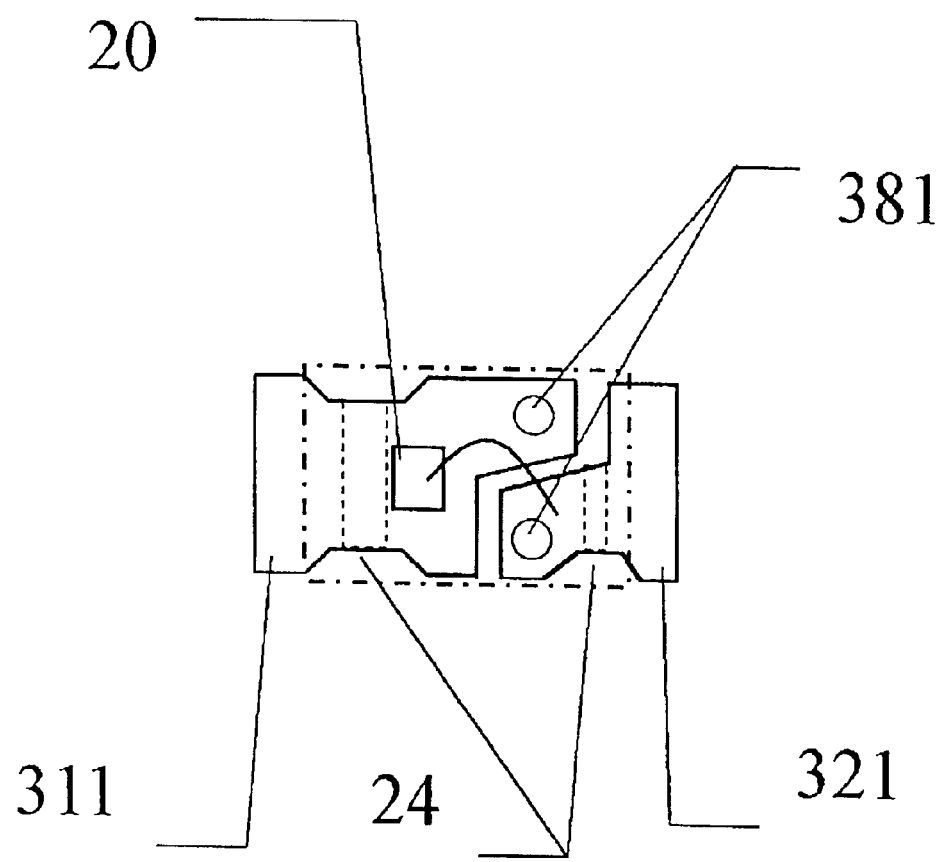
FIG. 10 shows through holes in the contact metals for the glue to flow through and solidify.

FIG. 10 shows a seventh embodiment of the invention. The structure is similar to FIG. 3, except that two through holes 381 extend from the top surfaces of the metal plates 321, 311 to the bottom recess 27 (best shown in FIG. 3). The through holes allow glue 25 to flow into the through holes 381, thus further solidifying the structure. Notches 24 further facilitate the glue flow to form the LED package.

Figure 11:
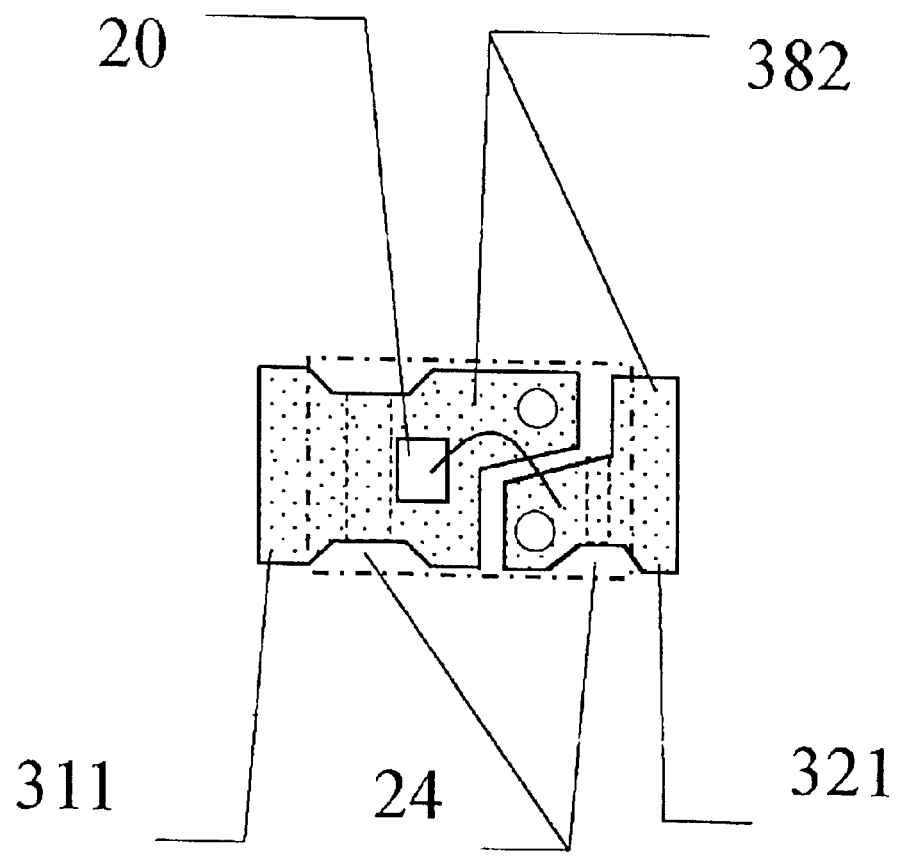
FIG. 11 shows roughened surfaces of the contact metal plates for increasing the contact between glue and the metal plates.

FIG. 11 shows an eighth embodiment of the invention. The structure is similar to FIG. 10, except that the top surfaces 382 of the metal plates 311, 321 are roughened. The roughened surfaces increase the grip of the glue to the structure to further solidify the structure.

Figure 12:
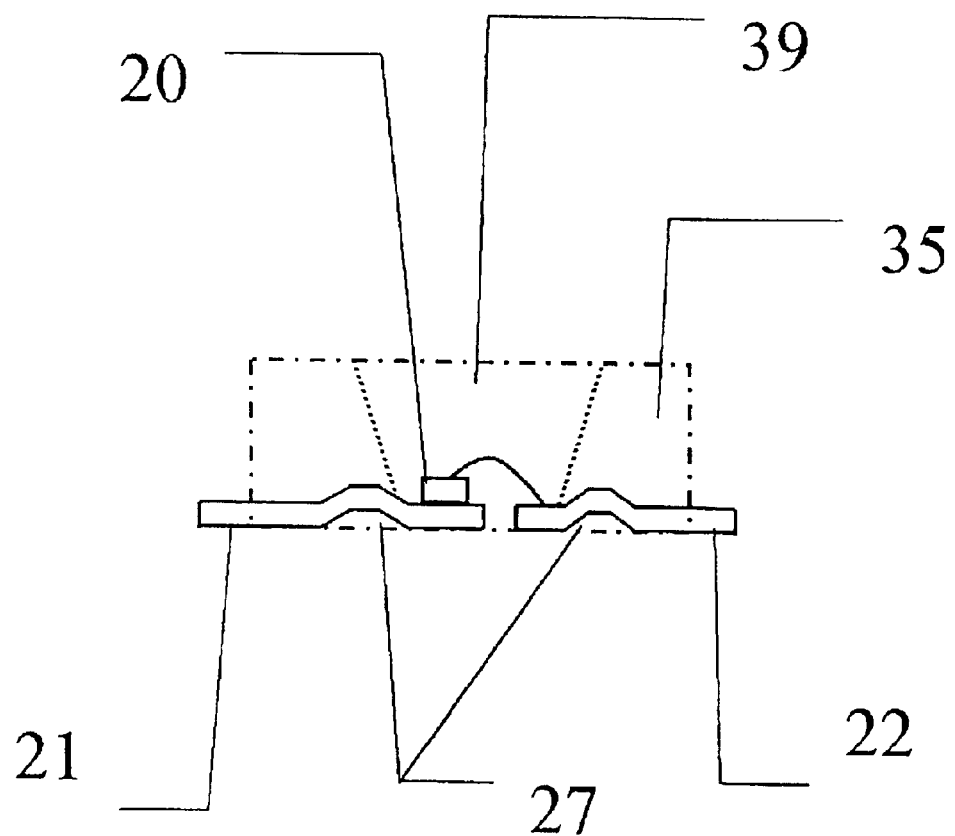
FIG. 12 shows a glue layer with a cup-shaped opening for focusing the light omitted from the LED.

FIG. 12 shows a ninth embodiment of the invention. The structure is similar to FIG. 3, except that the glue 35 on the top of the metal plates 21, 22 forms a cup 39 to expose the LED 20. The cup surface helps to focus the light emitted from the LED 20.

Figure 13:
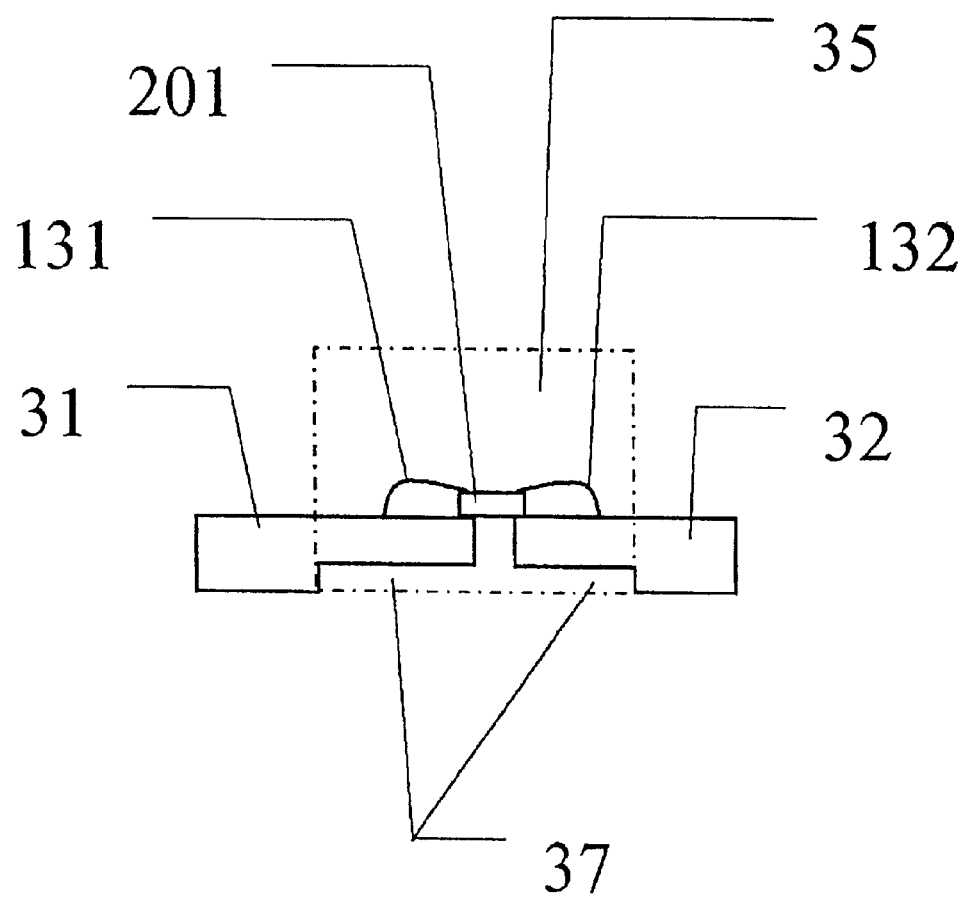
FIG. 13 shows a package for mounting a LED with two top electrodes.

FIG. 13 shows a tenth embodiment of the present invention. The structure is similar to FIG. 7, except that the LED 201 has two top electrodes. The LED 201 is wire-bonded to the plates 31 and 32 respectively by top wires 131 and 132.

Figure 14:
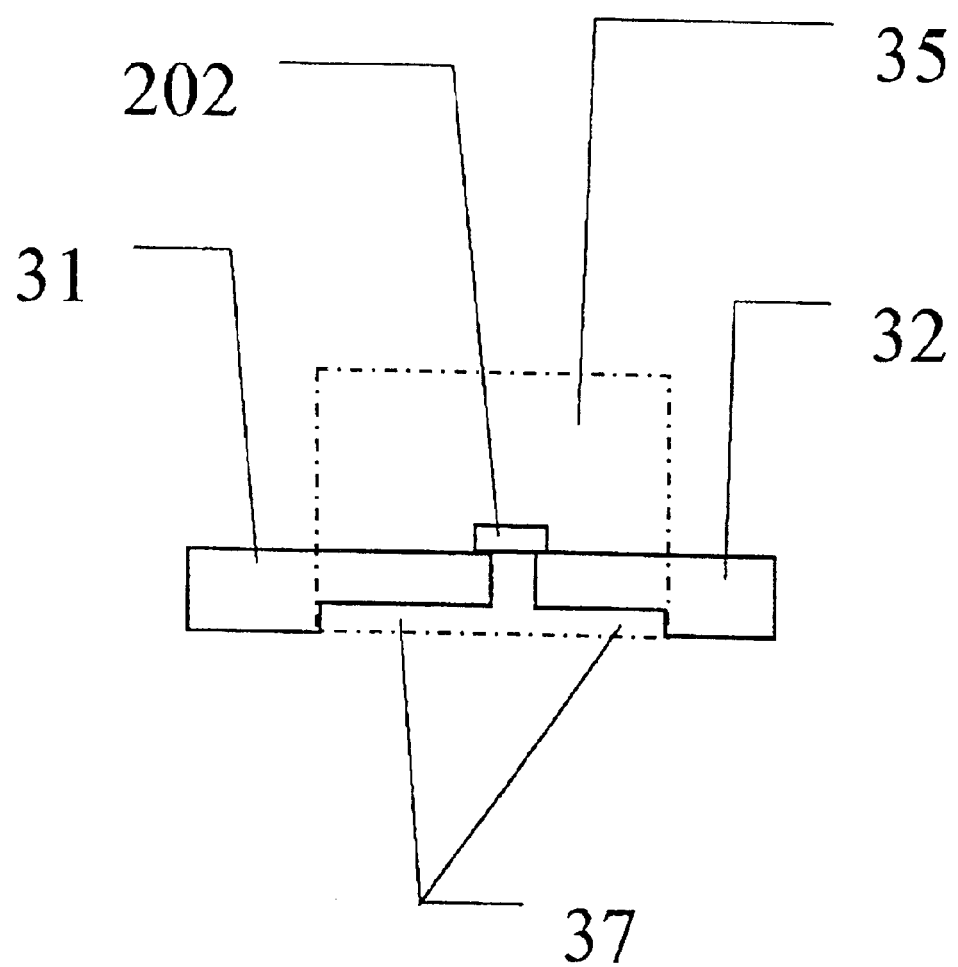
FIG. 14 shows a package for mounting a LED with two bottom electrodes.

FIG. 14 shows an eleventh, embodiment of the invention. The structure is similar to FIG. 7, except that the LED 202 has two bottom electrodes. The LED is bonded to the metal plates 31, 32 by its bottom electrodes.

While the preferred embodiments of the invention have been described, it will be apparent to those skilled in the art that various modifications may be made in the embodiments without departing from the spirit of the present invention. Such modifications are all within the scope of this invention.

What is claimed is:

1. A surface mounted light emitting diode (LED) package, comprising:

a light emitting diode (LED) having a first electrode and a second electrode;

a first metal contact plate having a first bottom recess and a first hole extending through said first metal contact plate;

a second metal contact plate having a second bottom recess and a second hole extending through said second metal contact plate, said LED being positioned on at least one of said first and second metal contact plates; and a glue covering said LED, portions of the top surface of said first and second metal contact plates, and filling said first and second bottom recesses through said first and second holes, thus forming encapsulated LED package;

said first metal contact plate and said second metal contact plate having portions thereof extending outside the borders of said encapsulated LED package to provide enlarged soldering areas for soldering said encapsulated LED package to a motherboard, wherein said first and second bottom recesses are shaped to provide an enlarged receiving cavity for the glue, and wherein said first and second holes provide a passage for said glue to said bottom recesses for said glue to deposit therein.

2. A surface mounted light emitting diode (LED) package, comprising:

a light emitting diode (LED) having a first electrode and a second electrode;

a first metal contact plate having a first bottom recess, said first metal contact plate being mounted with said LED and connected to said first electrode;

a second metal contact plate having a second bottom recess and connected to said second electrode of said LED;

a glue covering said LED, a portion of the top surface of said first metal contact plate, a portion of the top surface of said second metal contact plate, and filling said first and second bottom recesses, thus forming encapsulated LED package;

extensions of said first metal contact plate and said second metal contact plate extending outside the borders of said encapsulated LED package to provide contact and soldering areas to a motherboard; and an opening formed in said glue of said encapsulated LED package exposing said LED to focus radiation emitted from said LED.

3. The surface mounted light emitting diode (LED) package of claim 1, wherein said LED is mounted on both said first and second metal contact plates, with said first electrode of said LED in contact with said first metal contact plate, and with said second electrode of said LED in contact with said second metal contact plate.

4. The surface mounted light emitting diode package as recited in claim 1 where the number of said light emitting diodes in said packages is less than three.

5. The surface mounted light emitting diode package as recited in claim 1 where the number of said light emitting diodes is one.

6. The surface mounted light emitting diode (LED) package of claim 3, wherein said first and second electrodes of said LED are top electrodes.

7. The surface mounted light emitting diode (LED) package of claim 3, wherein said first and second electrodes of said LED are bottom electrodes.

8. The surface mounted light emitting diode (LED) package of claim 3, wherein top surfaces of said first and second metal contact plates are roughened to increase the grip of the glue thereto.

9. The surface mounted light emitting diode (LED) package of claim 3, wherein said bottom recesses are rectangularly shaped bottom recesses.

10. The surface mounted light emitting diode (LED) package of claim 3, wherein said bottom recesses are orthogonally shaped bottom recesses.

* * * * *